(12) United States Patent
Han et al.

(10) Patent No.: US 10,551,632 B2
(45) Date of Patent: Feb. 4, 2020

(54) PANEL DEVICE AND DISPLAY DEVICE

(71) Applicant: SAMSUNG ELECTRONICS CO., LTD., Suwon-si (KR)

(72) Inventors: Seung Ryong Han, Yongin-si (KR); Sung Tae Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 39 days.

(21) Appl. No.: 15/798,747

(22) Filed: Oct. 31, 2017

(65) Prior Publication Data

US 2018/0120577 A1  May 3, 2018

(30) Foreign Application Priority Data

Nov. 1, 2016  (KR) .................. 10-2016-0144299

(51) Int. Cl.
| | | |
|---|---|---|
| *G02B 27/26* | (2006.01) | |
| *H04N 13/337* | (2018.01) | |
| *H01L 25/075* | (2006.01) | |
| *H01L 27/15* | (2006.01) | |
| *H01L 33/58* | (2010.01) | |

(52) U.S. Cl.
CPC .......... *G02B 27/26* (2013.01); *H04N 13/337* (2018.05); *H01L 25/0753* (2013.01); *H01L 27/156* (2013.01); *H01L 33/58* (2013.01)

(58) Field of Classification Search
CPC .............................. H04N 13/337; G02B 27/26
USPC ................... 359/465; 348/58; 257/59
See application file for complete search history.

(56) References Cited

U.S. PATENT DOCUMENTS

| | | | |
|---|---|---|---|
| 7,164,529 B2 | 1/2007 | Sekizawa et al. | |
| 8,542,270 B2 | 9/2013 | Nelson | |
| 8,933,867 B2* | 1/2015 | Yoon ................... | H01L 27/3276 345/76 |
| 2004/0114232 A1 | 6/2004 | Sekizawa et al. | |
| 2007/0043466 A1 | 2/2007 | Vesely et al. | |
| 2010/0231701 A1* | 9/2010 | Nelson ................... | G02B 27/26 348/58 |
| 2012/0050261 A1* | 3/2012 | Feng .................. | G02B 27/2242 345/419 |
| 2012/0292621 A1* | 11/2012 | Kim .................... | H01L 27/3223 257/59 |
| 2012/0320457 A1* | 12/2012 | Horikoshi .............. | G02B 27/26 359/465 |
| 2013/0314515 A1 | 11/2013 | Shestak et al. | |

FOREIGN PATENT DOCUMENTS

| | | |
|---|---|---|
| EP | 2 631 702 A2 | 8/2013 |
| WO | 2010/104881 A2 | 9/2010 |

OTHER PUBLICATIONS

Communication dated Mar. 20, 2018, issued by the European Patent Office in counterpart European application 17198394.3.

* cited by examiner

*Primary Examiner* — Audrey Y Chang
(74) *Attorney, Agent, or Firm* — Sughrue Mion, PLLC (57) ABSTRACT

A panel device includes a display panel including a plurality of pixels, each of the plurality of pixels including a light source area and a non-light source area, and a polarizing film including a left eye pattern and a right eye pattern alternately arranged line-by-line in a diagonal direction of the plurality of pixels, the polarizing film is disposed on the display panel such that a border between the left eye pattern and the right eye pattern is disposed over the non-light source area and not over the light source area.

14 Claims, 10 Drawing Sheets

: left

: right

PANEL DEVICE AND DISPLAY DEVICE

CROSS-REFERENCE TO RELATED APPLICATION(S)

This application claims priority from Korean patent application 10-2016-0144299, filed on Nov. 1, 2016 in the Korean Intellectual Property Office, the entire disclosure of which is incorporated herein by reference.

BACKGROUND

1. Field

Apparatuses and methods consistent with example embodiments relate to a panel device and a display device that display a three-dimensional (3D) image.

2. Description of Related Art

With the development of digital technologies, various forms of electronic products have been developed and used, and most of recently developed electronic devices include displays.

In recent years, display devices have been developed to display a 3D image as well as a 2D image to provide realistic contents. 3D display devices may generally provide a 3D image to a user based on binocular disparity.

SUMMARY 3D display devices based on binocular disparity may be mainly classified into a shutter glasses 3D display device that displays a 3D image by a time division scheme and a film patterned retarder (FPR) type 3D display device that displays a 3D image by a space division scheme.

An FPR type 3D display device may have a display panel to which a polarizing film including a left eye pattern and a right eye pattern is attached, and may allow an image displayed on the display panel to be differently polarized through the left eye pattern and the right eye pattern, and a user may perceive a left eye image and a right eye image through glasses worn by the user. A polarizing film used for an FPR type 3D display device may be mainly classified into a polarizing film of an interlace type and a polarizing film of a checkerboard type.

Aspects of example embodiments address at least the above-mentioned problems and/or disadvantages and to provide at least the advantages described below. Accordingly, an aspect of example embodiments is to provide a panel device and a display device that show a left eye image and a right eye image in a checkerboard form for a user by using a polarizing film of an interlace type.

According to an aspect of an example embodiment, a panel device includes a display panel including a plurality of pixels, each of the plurality of pixels including a light source area and a non-light source area; and a polarizing film comprising a left eye pattern and a right eye pattern alternately arranged line-by-line in a diagonal direction of the plurality of pixels, wherein the polarizing film is disposed on the display panel such that a border between the left eye pattern and the right eye pattern is disposed over the non-light source area and not over the light source area.

The light source area may include at least one light emitting diode (LED).

A horizontal length of the light source area may be less than or equal to one-half of a horizontal gap between the plurality of pixels, and a vertical length of the light source area may be less than or equal to one-half of a vertical gap between the plurality of pixels.

The plurality of pixels may be arranged in a matrix form in a horizontal direction and a vertical direction of the display panel.

The plurality of pixels may be arranged in a matrix form in an oblique direction of the display panel.

The left eye pattern and the right eye pattern may be alternately arranged line-by-line in a horizontal direction or a vertical direction of the display panel.

The non-light source area may include a material that absorbs light received from outside of the panel device.

The polarizing film may include, in an area over the non-light source area, a material that absorbs light received from outside of the panel device.

According to an aspect of another example embodiment, there is provided a display device including a display; and a processor configured to control the display to display an image on the display, wherein the display includes: a display panel including a plurality of pixels, each of the plurality of pixels including a light source area and a non-light source area; and a polarizing film including a left eye pattern and a right eye pattern alternately arranged line-by-line in a diagonal direction of the plurality of pixels, wherein the polarizing film is disposed on the display panel such that a border between the left eye pattern and the right eye pattern is disposed over the non-light source area and not over the light source area.

The light source area may include at least one light emitting diode (LED).

A horizontal length of the light source area may be less than or equal to one-half of a horizontal gap between the plurality of pixels, and a vertical length of the light source area may be less than or equal to one-half of a vertical gap between the plurality of pixels.

The plurality of pixels may be arranged in a matrix form in a horizontal direction and a vertical direction of the display panel.

The plurality of pixels may be arranged in a matrix form in an oblique direction of the display panel.

The left eye pattern and the right eye pattern may be alternately arranged line-by-line in a horizontal direction or a vertical direction of the display panel.

The non-light source area may include a material that absorbs light received from outside of the display device.

The polarizing film may include, in an area over the non-light source area, a material that absorbs light received from outside of the display device.

According to one or more example embodiments, a panel device or a display device of a checkerboard type may be implemented by using a polarizing film of an interlace type. Accordingly, it is possible to improve a user's cognitive resolution. In addition, it is possible to minimize a phenomenon in which a non-light source area is shown to a user's eyes due to light input from the outside and to improve the quality of an image displayed on the panel device.

Other aspects, advantages, and salient features of the disclosure will become apparent to those skilled in the art from the following detailed description, which, taken in conjunction with the annexed drawings, discloses one or more example embodiments.

BRIEF DESCRIPTION OF THE DRAWINGS

The above and other aspects, features, and advantages of example embodiments will be more apparent from the following description taken in conjunction with the accompanying drawings, in which.

Throughout the drawings, it should be noted that like reference numbers are used to depict the same or similar elements, features, and structures.

DETAILED DESCRIPTION

Below, one or more example embodiments will be described with reference to the accompanying drawings. Accordingly, those of ordinary skill in the art will recognize that modifications, equivalents, and/or alternatives on the various embodiments described herein can be variously made without departing from the scope and spirit of the present disclosure. With regard to description of drawings, similar elements may be marked by similar reference numerals.

Figure 1A:
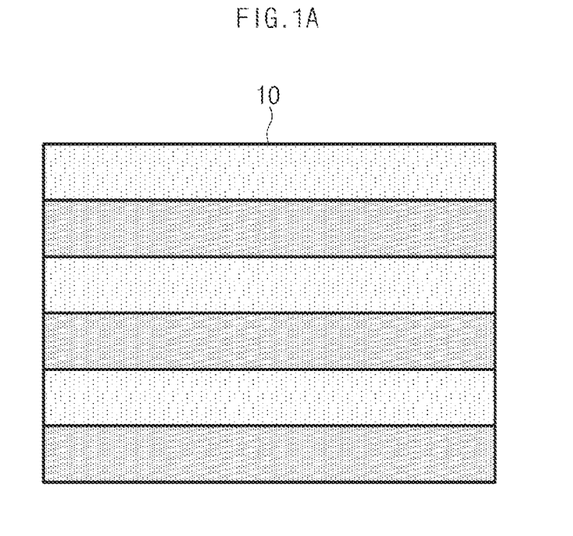
FIGS. 1A and 1B illustrate various examples of a polarizing film employed for a 3D display, according to an example embodiment.
Figure 1B:
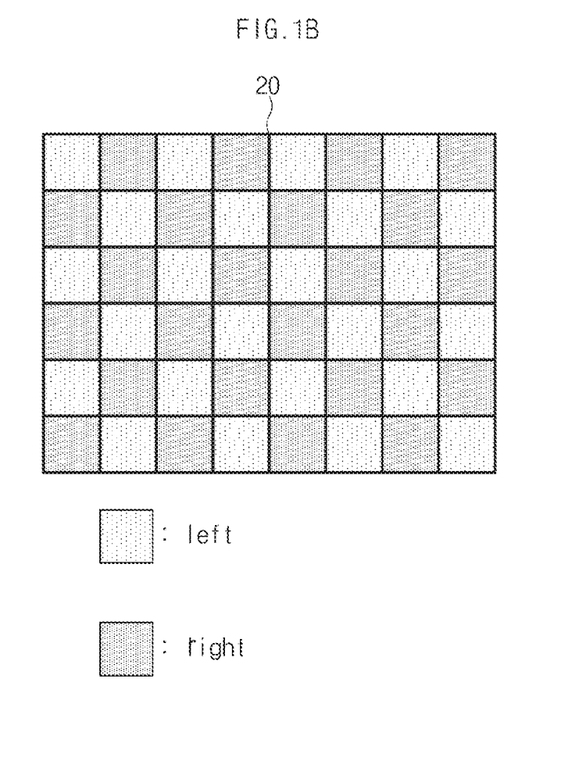

FIGS. 1A and 1B illustrate various examples of a polarizing film employed for a 3D display.

Referring to FIGS. 1A and 1B, a polarizing film used for a film patterned retarder (FPR) type 3D display may include a polarizing film 10 of an interlace type and a polarizing film 20 of a checkerboard type. The polarizing film 10 of an interlace type may have a left eye pattern and a right eye pattern alternately arranged line-by-line, and the polarizing film 20 of a checkerboard type may have a left eye pattern and a right eye pattern alternately arranged on pixel-by-pixel.

The polarizing film 10 of an interlace type may have advantages in low manufacturing cost and relatively easy manufacturing process. However, the polarizing film 10 of an interlace type may have a disadvantage in that a left eye image and a right eye image alternate with each other line-by-line, and thus cognitive resolution is lowered. The polarizing film 20 of a checkerboard type may have a relatively high cognitive resolution since a left eye image and a right eye image alternate with each other pixel-by-pixel. However, the polarizing film 20 of a checkerboard type may have disadvantages of high manufacturing cost and difficult manufacturing process.

A panel device according to one or more example embodiments may implement a display of a checkerboard type by using the polarizing film 10 of an interlace type.

Figure 2:
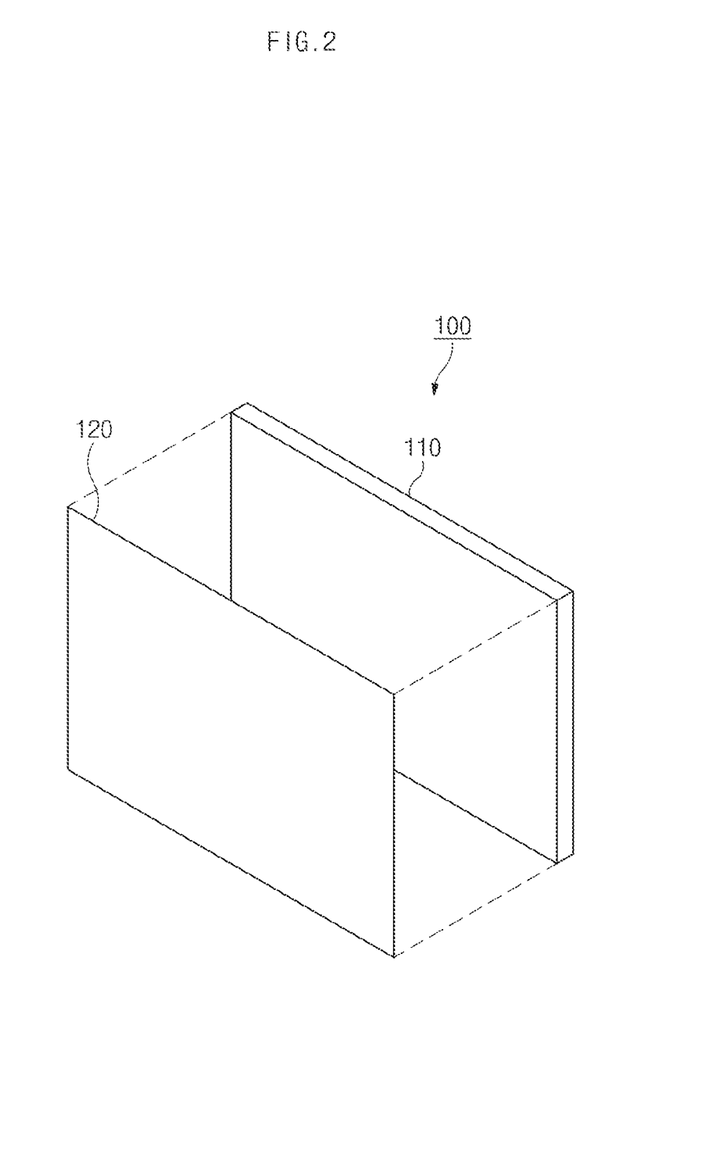
FIG. 2 illustrates a structure of a panel device according to one or more example embodiments.

FIG. 2 illustrates a structure of a panel device according to one or more example embodiments.

Referring to FIG. 2, a panel device 100 may include a display panel 110 and a polarizing film 120.

According to an embodiment, the display panel 110 may display an image. For example, the display panel 110 may display a 2D or 3D image.

According to an embodiment, the polarizing film 120 may be disposed on the display panel 110. According to an embodiment, the polarizing film 120 may be a polarizing film of an interlace type that has a left eye pattern and a right eye pattern alternately arranged line-by-line. According to an embodiment, the polarizing film 120 may include a plurality of layers. For example, the polarizing film 120 may include a polarizing layer and a phase retardation layer. For example, the polarizing layer may change the direction of an electric field of a 3D image displayed on the display panel 110 into a linear form. For example, the phase retardation layer may change the phase of a 3D image with linearly polarized light to allow a left eye image and a right eye image to have a phase difference of 90° therebetween.

Figure 3:
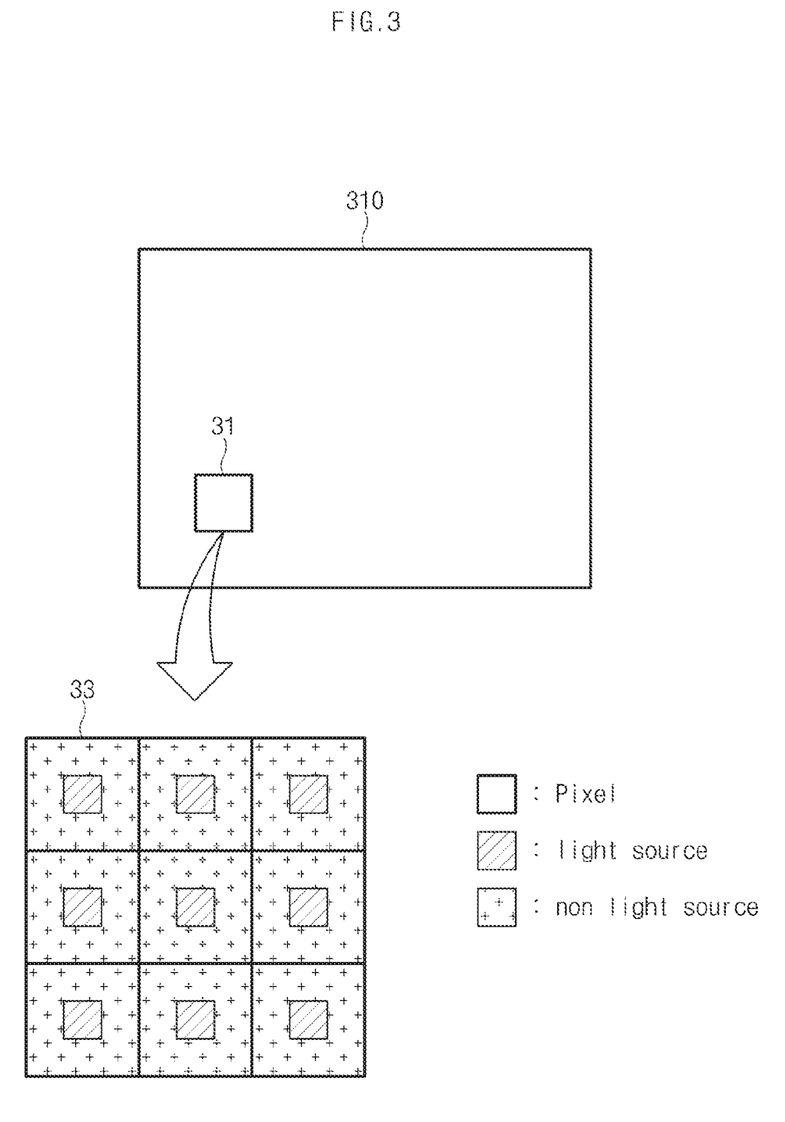
FIG. 3 illustrates a structure of a display panel according to one or more example embodiments.

FIG. 3 illustrates a structure of a display panel according to one or more example embodiments.

Referring to an image 33 obtained by magnifying a region 31 of a display panel 310 illustrated in FIG. 3 (e.g., the display panel 110 illustrated in FIG. 2), the display panel 310 may include a plurality of pixels.

According to an embodiment, each of the plurality of pixels may include a light source area and a non-light source area. According to an embodiment, the light source area may include at least one light emitting diode (LED). For example, the light source area may include red, green, and blue LEDs. According to an embodiment, the non-light source area may be a black matrix area.

According to an embodiment, the plurality of pixels may be arranged in a matrix form in the display panel 310. For example, the plurality of pixels may be arranged in a matrix form in the display panel 310 in the horizontal direction and the vertical direction of the display panel 310.

According to an embodiment, the light source area may have a polygonal shape. For example, the light source area may have a square shape, as illustrated in FIG. 3. In another example, the light source area may have a rectangular or regular-hexagonal shape.

Figure 4A:
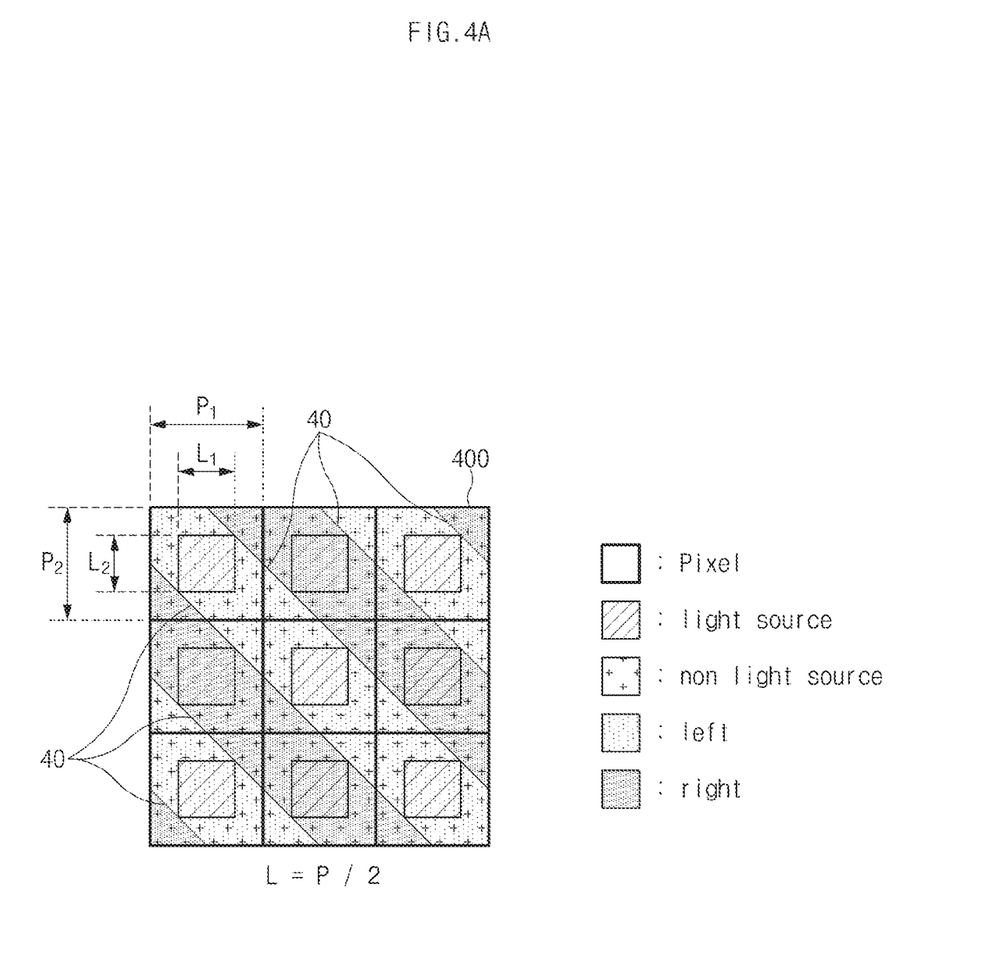
FIGS. 4A and 4B illustrate structures of panel devices according to one or more example embodiments.
Figure 4B:
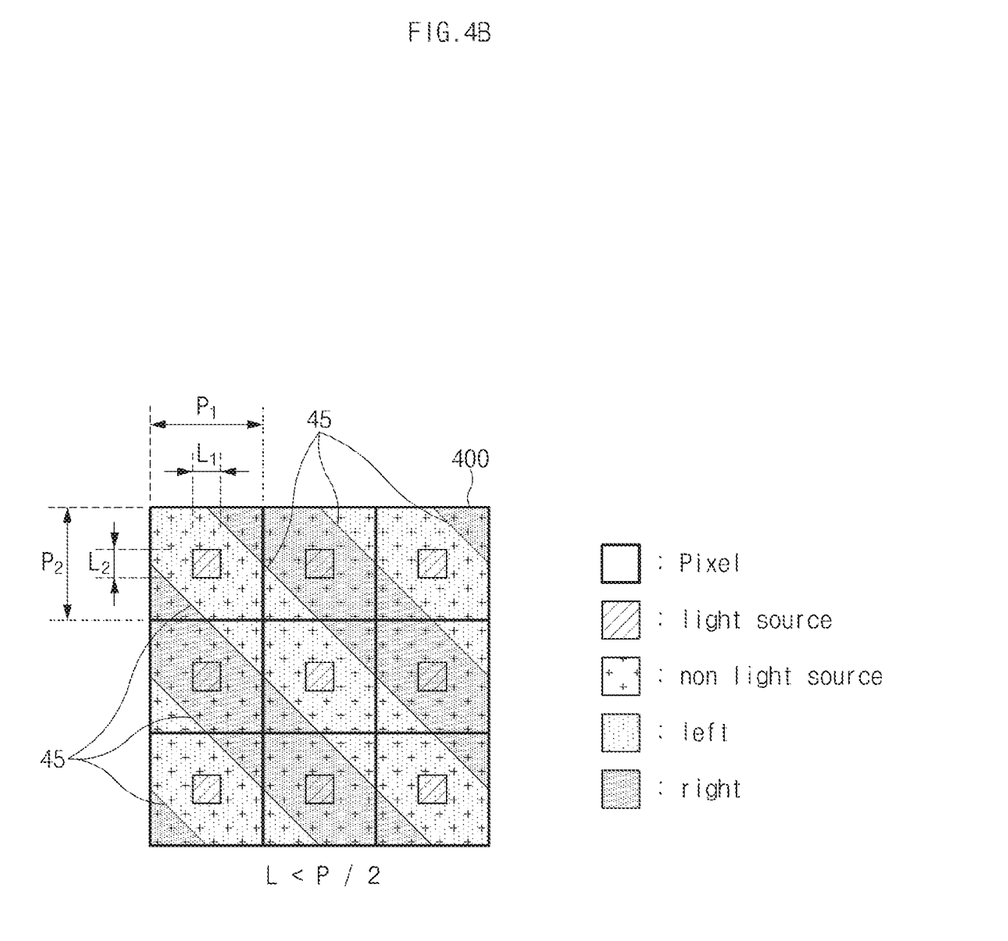

FIGS. 4A and 4B illustrate structures of panel devices according to one or more example embodiments.

A panel device 400 illustrated in FIG. 4A may include a display panel (e.g., the display panel 310 illustrated in FIG. 3) and a polarizing film disposed on the display panel.

According to an embodiment, the display panel may include a plurality of pixels. According to an embodiment, the length L of light source areas included in the display panel may be equal to one-half of the gap P between the plurality of pixels. For example, the horizontal length L1 of the light source areas may be equal to one-half of the horizontal gap P1 between the plurality of pixels. In another example, the vertical length L2 of the light source areas may be equal to one-half of the vertical gap P2 between the plurality of pixels.

According to an embodiment, the polarizing film may include a left eye pattern and a right eye pattern. According to an embodiment, the left eye pattern and the right eye pattern may be alternately arranged line-by-line in an oblique direction of the display panel. For example, the left eye pattern and the right eye pattern may be alternately arranged line-by-line in a diagonal direction of the plurality of pixels included in the display panel.

According to an embodiment, the polarizing film may be disposed on the display panel such that borders 40 between the left eye pattern and the right eye pattern overlap non-light source areas other than the light source areas. For example, the borders 40 between the left eye pattern and the right eye pattern may be located on only the non-light source areas. According to an embodiment, in the case where the length L of the light source areas included in the display panel is equal to one-half of the gap P between the plurality of pixels, the polarizing film may be disposed on the display panel such that the borders 40 between the left eye pattern and the right eye pattern are adjacent to some (e.g., two) of the corners of each light source area.

The panel device 400 illustrated in FIG. 4B may include a display panel (e.g., the display panel 310 illustrated in FIG. 3) and a polarizing film disposed on the display panel.

According to an embodiment, the display panel may include a plurality of pixels. According to an embodiment, the length L of light source areas included in the display panel may be less than one-half of the gap P between the plurality of pixels. For example, the horizontal length L1 of the light source areas may be less than one-half of the horizontal gap P1 between the plurality of pixels. In another example, the vertical length L2 of the light source areas may be less than one-half of the vertical gap P2 between the plurality of pixels.

According to an embodiment, the polarizing film may include a left eye pattern and a right eye pattern. According to an embodiment, the left eye pattern and the right eye pattern may be alternately arranged line-by-line in an oblique direction of the display panel. For example, the left eye pattern and the right eye pattern may be alternately arranged line-by-line in a diagonal direction of the plurality of pixels included in the display panel.

According to an embodiment, the polarizing film may be disposed on the display panel such that borders 45 between the left eye pattern and the right eye pattern overlap non-light source areas other than the light source areas. For example, the borders 45 between the left eye pattern and the right eye pattern may be located on only the non-light source areas. According to an embodiment, in the case where the length L of the light source areas included in the display panel is less than one-half of the gap P between the plurality of pixels, the polarizing film may be disposed on the display panel such that the borders 45 between the left eye pattern and the right eye pattern are not adjacent to corners of each light source area.

According to an embodiment, in the case where the length L of the light source areas included in the display panel is less than one-half of the gap P between the plurality of pixels, the polarizing film may be disposed on the display panel such that the borders 45 between the left eye pattern and the right eye pattern are adjacent to some (e.g., one) of the corners of each light source area. For example, referring to FIG. 4B, the polarizing film may be disposed on the display panel such that the borders 45 between the left eye pattern and the right eye pattern are displaced rightwards (or upwards) or leftwards (or downwards) and thus adjacent to some of the corners of each light source area.

According to an embodiment, the angle (e.g., an acute angle) that the borders between the left eye pattern and the right eye pattern of the polarizing film form with borders between the pixels may be determined by the horizontal gap P1 and the vertical gap P2 between the pixels. For example, the angle that the borders between the left eye pattern and the right eye pattern of the polarizing film form with the borders between the pixels may be determined by Equation 1 below.

$$\tan \theta = P2/P1 \qquad \text{[Equation 1]}$$

For example, in the case where the horizontal gap P1 and the vertical gap P2 between the pixels are equal to each other, the angle ($\theta$) that the borders between the left eye pattern and the right eye pattern of the polarizing film form with the borders between the pixels may be determined to be 45° by Equation 1. The angle $\theta$ may be between 0° and 45° in the case where the horizontal gap P1 between the pixels is greater than the vertical gap P2 between the pixels, and may be between 45° and 90° in the case where the horizontal gap P1 between pixels is less than the vertical gap P2 between the pixels.

According to the embodiments described above with reference to FIGS. 4A and 4B, the polarizing films may be disposed on the display panels such that the borders 40, 45 between the left eye pattern and the right eye pattern overlap the non-light source areas other than the light source areas. According to another example embodiment, the polarizing films may be disposed on the display panels such that the borders between the left eye pattern and the right eye pattern partly overlap the light source areas. For example, in the case where the length L of the light source areas included in the display panel exceeds one-half of the gap P between the plurality of pixels, the borders between the left eye pattern and the right eye pattern may overlap the light source areas. In another example, the polarizing films may be disposed on the display panels such that the borders 40, 45 between the left eye pattern and the right eye pattern are displaced upwards or downwards to overlap the light source areas. In the case where the borders between the left eye pattern and the right eye pattern of the polarizing film overlap the light source areas, crosstalk may occur between a left eye image and a right eye image. In the case where the crosstalk occurs, a user may feel dizzy, or image quality may be deteriorated. However, as long as the user cannot perceive the crosstalk, the polarizing film may be disposed such that the borders between the left eye pattern and the right eye pattern partly overlap the light source areas.

Figure 5:
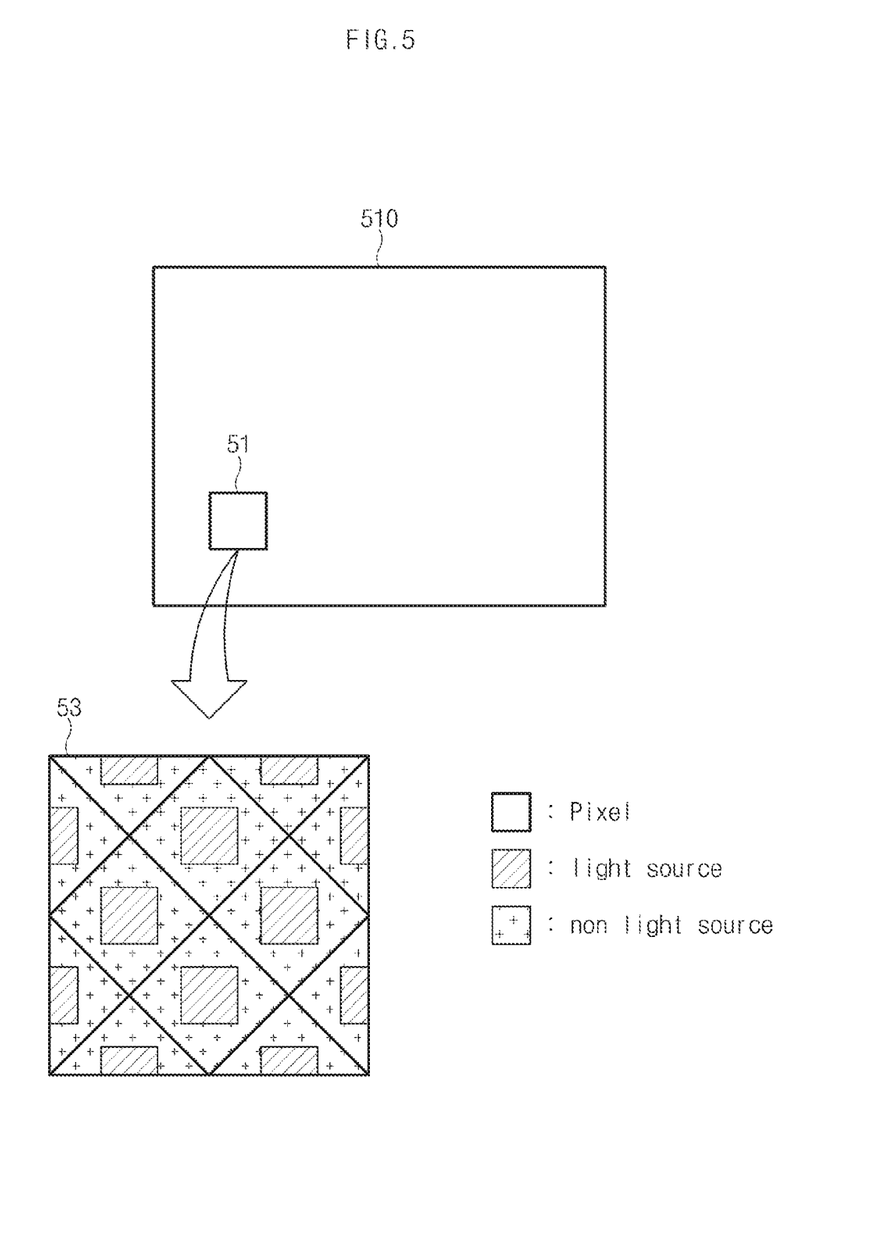
FIG. 5 illustrates a structure of a display panel according to one or more example embodiments.

FIG. 5 illustrates a structure of a display panel according to one or more example embodiments.

Referring to an image 53 obtained by magnifying a region 51 of a display panel 510 illustrated in FIG. 5 (e.g., the display panel 110 illustrated in FIG. 2), the display panel 510 may include a plurality of pixels.

According to an embodiment, each of the plurality of pixels may include a light source area and a non-light source area. According to an embodiment, the light source area may include at least one light emitting diode (LED). For example, the light source area may include red, green, and blue LEDs. According to an embodiment, the non-light source area may be a black matrix area.

According to an embodiment, the plurality of pixels may be arranged in a matrix form in the display panel 510. For example, the plurality of pixels may be arranged in a matrix form in the display panel 510 in an oblique direction of the display panel 510.

According to an embodiment, the light source areas included in the respective pixels may be arranged in a different direction from those of the pixels. For example, the light source areas included in the respective pixels may be arranged in a matrix form in the horizontal or vertical direction of the display panel 510 (or in a diagonal direction of the pixels).

According to an embodiment, the light source areas may have a polygonal shape. For example, the light source areas may have a square shape, as illustrated in FIG. 5. In another example, the light source areas may have a rectangular or a regular-hexagonal shape.

Figure 6A:
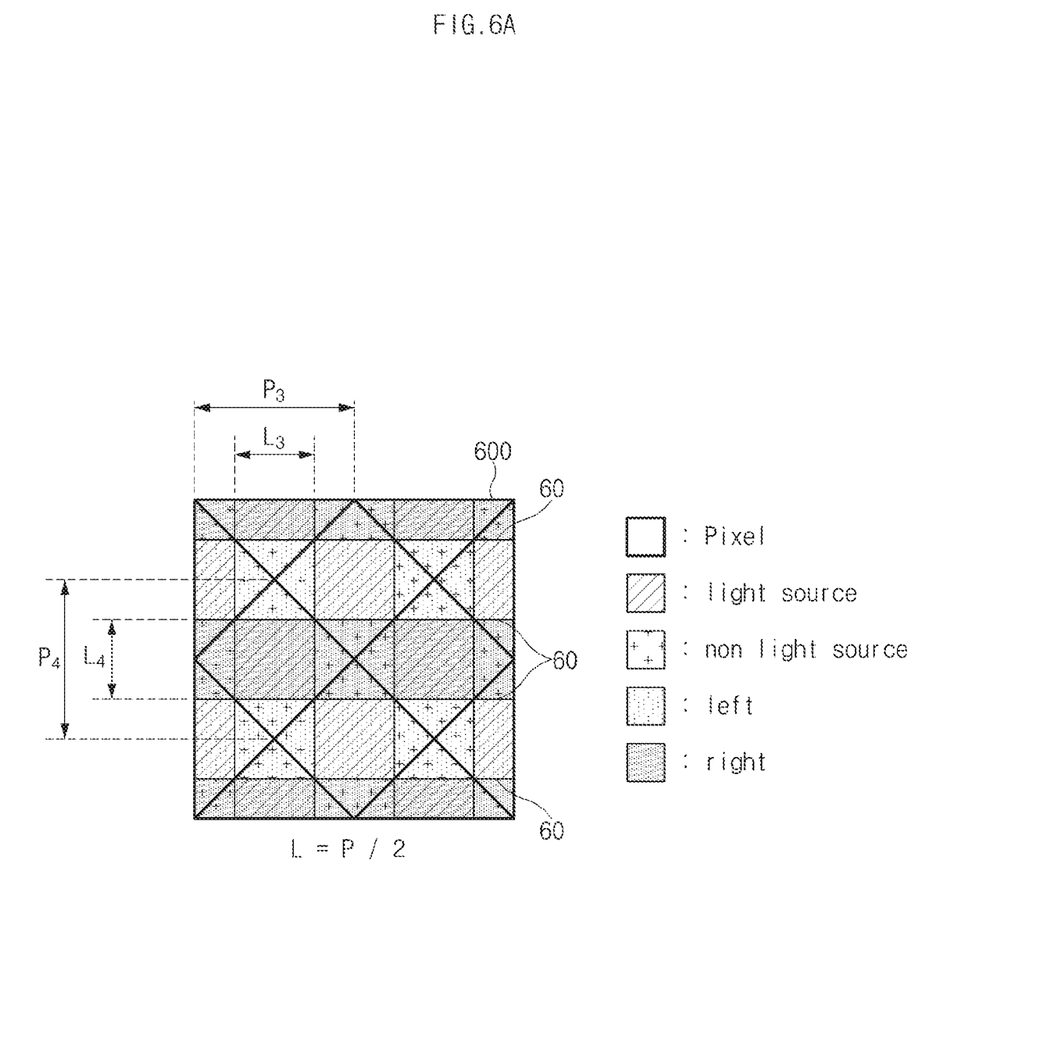
FIGS. 6A and 6B illustrate structures of panel devices according to one or more example embodiments.
Figure 6B:
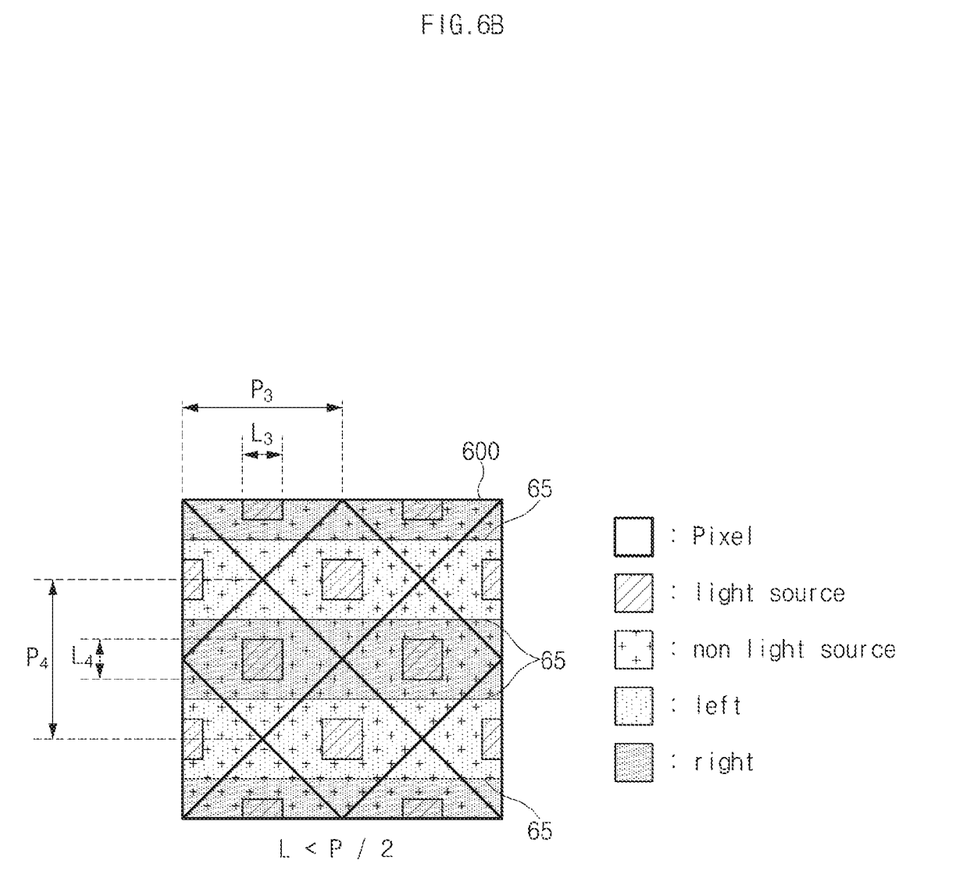

FIGS. 6A and 6B illustrate structures of panel devices according to one or more example embodiments.

A panel device 600 illustrated in FIG. 6A may include a display panel (e.g., the display panel 510 illustrated in FIG.

5) and a polarizing film (e.g., the polarizing film 120 of FIG. 2) disposed on the display panel.

According to an embodiment, the display panel may include a plurality of pixels. According to an embodiment, the length L of light source areas included in the display panel may be equal to one-half of the gap P between the plurality of pixels. For example, the horizontal length L3 of the light source areas may be equal to one-half of the horizontal gap P3 between the plurality of pixels. In another example, the vertical length L4 of the light source areas may be equal to one-half of the vertical gap P4 between the plurality of pixels. In the case where the length L of the light source areas is equal to one-half of the gap P between the plurality of pixels, corners of each light source area may be located adjacent to other light source areas and borders between the pixels.

According to an embodiment, the polarizing film may include a left eye pattern and a right eye pattern. According to an embodiment, the left eye pattern and the right eye pattern may be alternately arranged line-by-line in the horizontal direction of the display panel. According to another embodiment, the left eye pattern and the right eye pattern may be alternately arranged line-by-line in the vertical direction of the plurality of pixels included in the display panel.

According to an embodiment, the polarizing film may be disposed on the display panel such that borders 60 between the left eye pattern and the right eye pattern overlap non-light source areas other than the light source areas. According to an embodiment, in the case where the length L of the light source areas included in the display panel is equal to one-half of the gap P between the plurality of pixels, the polarizing film may be disposed on the display panel such that the borders 60 between the left eye pattern and the right eye pattern are adjacent to some (e.g., two) of the sides of each light source area.

The panel device 600 illustrated in FIG. 6B may include a display panel and a polarizing film disposed on the display panel.

According to an embodiment, the display panel may include a plurality of pixels. According to an embodiment, the length L of light source areas included in the display panel may be less than one-half of the gap P between the plurality of pixels. For example, the horizontal length L3 of the light source areas may be less than one-half of the horizontal gap P3 between the plurality of pixels. In another example, the vertical length L4 of the light source areas may be less than one-half of the vertical gap P4 between the plurality of pixels.

According to an embodiment, the polarizing film may include a left eye pattern and a right eye pattern. According to an embodiment, the left eye pattern and the right eye pattern may be alternately arranged line-by-line in the horizontal direction of the display panel. According to another embodiment, the left eye pattern and the right eye pattern may be alternately arranged line-by-line in the vertical direction of the plurality of pixels included in the display panel.

According to an embodiment, the polarizing film may be disposed on the display panel such that borders 65 between the left eye pattern and the right eye pattern overlap non-light source areas other than the light source areas. According to an embodiment, in the case where the length L of the light source areas included in the display panel is less than one-half of the gap P between the plurality of pixels, the polarizing film may be disposed on the display panel such that the borders 65 between the left eye pattern and the right eye pattern are not adjacent to sides of each light source area.

According to an embodiment, in the case where the length L of the light source areas included in the display panel is less than one-half of the gap P between the plurality of pixels, the polarizing film may be disposed on the display panel such that the borders 65 between the left eye pattern and the right eye pattern are adjacent to some (e.g., one) of the sides of each light source area. For example, referring to FIG. 6B, the polarizing film may be disposed on the display panel such that the borders 65 between the left eye pattern and the right eye pattern are displaced upwards (or downwards) and thus adjacent to some of the sides of each light source area.

According to the embodiments described above with reference to FIGS. 6A and 6B, the polarizing films may be disposed on the display panels such that the borders 60, 65 between the left eye pattern and the right eye pattern overlap the non-light source areas other than the light source areas. According to another example embodiment, the polarizing films may be disposed on the display panels such that the borders between the left eye pattern and the right eye pattern partly overlap the light source areas. For example, the polarizing films may be disposed on the display panels such that the borders 60, 65 between the left eye pattern and the right eye pattern are displaced upwards or downwards to overlap the light source areas. In the case where the borders between the left eye pattern and the right eye pattern of the polarizing film overlap the light source areas, crosstalk may occur between a left eye image and a right eye image. In the case where the crosstalk occurs, a user may feel dizzy, or image quality may be deteriorated. However, as long as the user cannot perceive the crosstalk, the polarizing film may be disposed such that the borders between the left eye pattern and the right eye pattern partly overlap the light source areas.

According to the embodiments described above with reference to FIGS. 2 to 6B, a panel device of a checkerboard type may be implemented by using a polarizing film of an interlace type.

According to an embodiment, the non-light source areas of the display panel 110 illustrated in FIG. 2 may include a material capable of absorbing light input from outside the panel device. For example, the non-light source areas may include, on the surface thereof, a material (e.g., a black material) that absorbs light.

Figure 7:
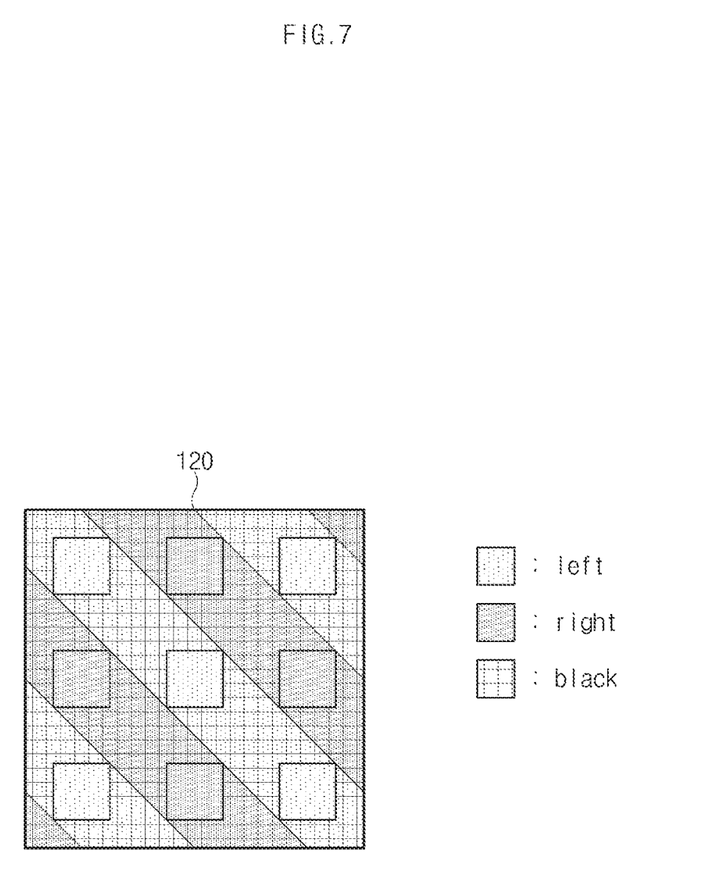
FIG. 7 illustrates a polarizing film according to one or more example embodiments.

FIG. 7 illustrates a polarizing film according to one or more example embodiments.

According to an embodiment, the polarizing film 120 may include a left eye pattern and a right eye pattern. According to an embodiment, the polarizing film 120 may include, in an area (black) overlapping non-light source areas of a display panel (e.g., the display panel 110 of FIG. 2), a material that absorbs light input from outside the panel device. For example, a material absorbing light may be printed on the area of the surface of the polarizing film 120 that overlaps the non-light source areas. In another example, the polarizing film 120 may further include, in the area overlapping the non-light source areas, an external-light absorbing layer that includes a material absorbing light input from outside the panel device.

The panel device according to one or more example embodiments may include, in the area overlapping the non-light source areas, a material absorbing light to minimize degradation in image quality or crosstalk, which is caused by a phenomenon in which the non-light source areas are seen by a user' eyes due to light input from the outside, thereby improving the quality of an image displayed on the panel device.

Figure 8:
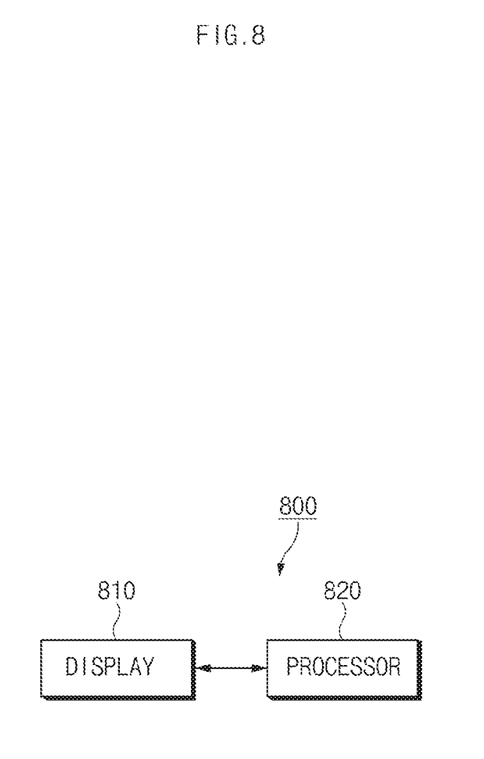
FIG. 8 is a block diagram illustrating a configuration of a display device according to one or more example embodiments.

FIG. 8 is a block diagram illustrating a configuration of a display device according to one or more example embodiments.

Referring to FIG. 8, a display device 800 may include a display 810 and a processor 820. The display device 800 illustrated in FIG. 8 may include a large screen display device (such as an electronic signage installed in a stadium, a screen installed in a movie theater, or the like), as well as display devices for home appliances, such as TV, a monitor, and the like.

According to an embodiment, the display 810 may include the panel device 100 illustrated in FIG. 2. According to an embodiment, the display panel 810 may display an image. For example, the display panel 810 may display a 2D or 3D image.

According to an embodiment, the processor 820 may control the display 810 to display an image on the display 810. According to an embodiment, when displaying a 3D image on the display 810, the processor 820 may display a left eye image by using pixels corresponding to a left eye pattern of a polarizing film (e.g., the polarizing film 120 of FIG. 2) and may display a right eye image by using pixels corresponding to a right eye pattern of the polarizing film.

According to one or more example embodiments, at least a part of an apparatus (e.g., modules or functions thereof) or a method (e.g., operations) may be, for example, implemented by instructions stored in a computer-readable storage media in the form of a program module. The instruction, when executed by a processor, may cause the processor to perform a function corresponding to the instruction. The computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, and the like. The instruction may include codes created by a compiler or codes that are capable of being executed by a computer by using an interpreter. According to one or more example embodiments, a module or a program module may include at least one of the above elements, or a part of the above elements may be omitted, or other elements may be further included.

Operations performed by a module, a program module, or other elements according to various embodiments may be executed sequentially, in parallel, repeatedly, or in a heuristic method. In addition, some of the operations may be executed in different sequences or may be omitted. Alternatively, other operations may be added. Example embodiments are provided merely to easily describe technical details of the present disclosure and to help the understanding of the present disclosure, and are not intended to limit the scope of the present disclosure. Therefore, it should be construed that all modifications and changes or various other embodiments fall within the scope of the present disclosure.

While the example embodiments have been shown and described with reference to various embodiments thereof, it will be understood by those skilled in the art that various changes in form and details may be made therein without departing from the spirit and scope of the present disclosure, as defined by the appended claims and their equivalents.

What is claimed is:

1. A panel device comprising:
a display panel comprising a plurality of pixels, each of the plurality of pixels comprising a light source area and a non-light source area; and
a polarizing film comprising a first pattern area and a second pattern area, the first pattern area and the second pattern area being alternately arranged line-by-line, and a border between the first pattern area and the second pattern area forms a line in a diagonal direction of the plurality of pixels,
wherein the polarizing film is disposed on the display panel such that the border between the first pattern area and the second pattern area is disposed over the non-light source area and not over the light source area, and
wherein a line forming an edge of the first pattern area is parallel to a line forming an edge of the second pattern area in the diagonal direction of the plurality of pixels.

2. The panel device of claim 1, wherein the light source area comprises at least one light emitting diode (LED).

3. The panel device of claim 1, wherein a horizontal length of the light source area is less than or equal to one-half of a horizontal distance across each pixel of the plurality of pixels, and
wherein a vertical length of the light source area is less than or equal to one-half of a vertical distance across each pixel of the plurality of pixels.

4. The panel device of claim 1, wherein the plurality of pixels are arranged in a matrix form in a horizontal direction and a vertical direction of the display panel.

5. The panel device of claim 1, wherein the plurality of pixels are arranged in a matrix form in an oblique direction of the display panel.

6. The panel device of claim 1, wherein the non-light source area comprises a material that absorbs light received from outside of the panel device.

7. The panel device of claim 1, wherein the polarizing film comprises, in an area over the non-light source area, a material that absorbs light received from outside of the panel device.

8. A display device comprising:
a display; and
a processor configured to control the display to display an image on the display,
wherein the display comprises:
a display panel comprising a plurality of pixels, each of the plurality of pixels comprising a light source area and a non-light source area; and
a polarizing film comprising a first pattern area and a second pattern area, the first pattern area and the second pattern area being alternately arranged line-by-line, and a border between the first pattern area and the second pattern area forms a line in a diagonal direction of the plurality of pixels,
wherein the polarizing film is disposed on the display panel such that the border between the first pattern area and the second pattern area is disposed over the non-light source area and not over the light source area, and
wherein a line forming an edge of the first pattern area is parallel to a line forming an edge of the second pattern area in the diagonal direction of the plurality of pixels.

9. The display device of claim 8, wherein the light source area comprises at least one light emitting diode (LED).

10. The display device of claim 9, wherein the polarizing film comprises, in an area over the non-light source area, a material that absorbs light received from outside of the display device.

11. The display device of claim 8, wherein a horizontal length of the light source area is less than or equal to one-half of a horizontal distance across each pixel of the plurality of pixels, and
wherein a vertical length of the light source area is less than or equal to one-half of a vertical distance across each pixel of the plurality of pixels.

12. The display device of claim 8, wherein the plurality of pixels are arranged in a matrix form in a horizontal direction and a vertical direction of the display panel.

13. The display device of claim 8, wherein the plurality of pixels are arranged in a matrix form in an oblique direction of the display panel.

14. The display device of claim 8, wherein the non-light source area comprises a material that absorbs light received from outside of the display device.

* * * * *